(12) United States Patent
Kim et al.

(10) Patent No.: US 9,235,664 B2
(45) Date of Patent: Jan. 12, 2016

(54) SYSTEMS AND METHODS FOR EXECUTING UNIFIED PROCESS-DEVICE-CIRCUIT SIMULATION

(75) Inventors: Kyung Rok Kim, Suwon-si (KR); Kyu-Baik Chang, Seoul (KR); Young Kwan Park, Suwon-si (KR); Seung Chul Lee, Seongnam-si (KR); Jin Kyu Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1313 days.

(21) Appl. No.: 12/607,206

(22) Filed: Oct. 28, 2009

(65) Prior Publication Data

US 2010/0114553 A1 May 6, 2010

(30) Foreign Application Priority Data

Oct. 30, 2008 (KR) ........................ 10-2008-0107223

(51) Int. Cl.
*G06F 17/50* (2006.01)
*G06G 7/62* (2006.01)
(Continued)

(52) U.S. Cl.
CPC ........ *G06F 17/5022* (2013.01); *G06F 11/3476* (2013.01); *G06F 13/105* (2013.01); *G06F 17/5009* (2013.01)

(58) Field of Classification Search
CPC .............. G06F 11/3476; G06F 13/105; G06F 17/5009; G06F 17/5022
USPC .................................. 703/14, 15, 16, 17, 20
See application file for complete search history.

(56) References Cited

U.S. PATENT DOCUMENTS 6,516,237 B1 * 2/2003 Aoki et al. ...................... 700/95
7,016,820 B2 * 3/2006 Kimura et al. .................... 703/2
(Continued)

FOREIGN PATENT DOCUMENTS

JP 2005-190262 7/2005
JP 2006-330970 7/2006
(Continued)

OTHER PUBLICATIONS

Marko, Chew, NPL, "A new Methodology for Concurrent Technology Development and Cell Library Optimization", 1999.*
(Continued)

*Primary Examiner* — Omar Fernandez Rivas
*Assistant Examiner* — Angel Calle
(74) *Attorney, Agent, or Firm* — Myers Bigel Sibley & Sajovec, P.A.

(57) ABSTRACT

A unified simulation system is provided. The unified simulation system includes an input database storing input data comprising an input parameter and environment information, a unified simulator executing a unified process-device-circuit simulation of characteristics of a semiconductor apparatus based on the input data and at least one predetermined model and outputting a simulation result as output data, and an output database storing the output data. The unified simulator includes a process simulator simulating at least one process based on the input data and outputting process characteristic data, a device simulator simulating at least one device based on the process characteristic data and outputting device characteristic data, and a circuit simulator simulating a circuit comprising the at least one device. Accordingly, multiple devices can be simultaneously optimized for the optimization of circuit characteristics and an accurate specification at process and device levels can be provided.

17 Claims, 12 Drawing Sheets

(51) Int. Cl.
*G06F 9/44* (2006.01)
*G06F 13/10* (2006.01)
*G06F 13/12* (2006.01)
*G06F 11/34* (2006.01)

(56) References Cited

U.S. PATENT DOCUMENTS

| | | | |
|---|---|---|---|
| 7,136,796 B2 | 11/2006 | Jakatdar et al. | |
| 7,340,708 B2 | 3/2008 | Hamazaki | |
| 7,702,413 B2* | 4/2010 | Ushiku et al. | 700/121 |
| 2003/0097246 A1* | 5/2003 | Hara et al. | 703/14 |
| 2005/0095774 A1* | 5/2005 | Ushiku et al. | 438/222 |
| 2007/0238204 A1* | 10/2007 | Kurihara et al. | 438/14 |

FOREIGN PATENT DOCUMENTS

| | | |
|---|---|---|
| JP | 2008-028418 | 2/2008 |
| KR | 1020030071575 A | 9/2003 |

OTHER PUBLICATIONS

P. Lloyd, NPL, "Technology CAD for Competitive Products", 1988.*
Takafumi, Tokunaga, NPL, "Semiconductor Process and Manufacturing Technologies for 90-nm Process Generation", 2002.*

* cited by examiner

FIG. 7A

|  | PROCESS ||
|---|---|---|
| Wafer No. | PROCESS1 | PROCESS2 |
| 1 | A1 | B1 |
| 2 | A2 | B2 |
| 3 | A3 | B3 |

FIG. 8A

| MATERIAL | STRESS | DENSITY |
|----------|--------|---------|
| MAT1 | S1 | D1 |
| MAT2 | S2 | D2 |
| MAT3 | S3 | D3 |

SYSTEMS AND METHODS FOR EXECUTING UNIFIED PROCESS-DEVICE-CIRCUIT SIMULATION

CROSS-REFERENCE TO RELATED APPLICATIONS

This application claims priority under 35 U.S.C. §119 to Korean Patent Application No. 10-2008-0107223 filed on Oct. 30, 2008, in the Korean Intellectual Property Office, the disclosure of which is incorporated herein in its entirety as if set forth fully herein.

BACKGROUND

The present invention relates to methods and apparatus for analyzing and simulating the characteristics of a semiconductor apparatus.

With the high density of integration and the minuteness of semiconductor devices, factors in a process, device and/or circuit may operate in combination with one another. In this regard, a plurality of devices integrated in a single substrate may exert an influence on each other. In addition, with the high density of integration and the minuteness, the process and device characteristics may be limited. In order to overcome limitations in semiconductor processes and devices, comprehend phenomena, and/or reduce experimental costs, demands on technology computer aided design (TOAD) processes and device simulation environments based on a physical simulation may be increasing in the semiconductor industry.

In order to provide the accurate specification of a semiconductor apparatus, characteristics of multiple devices at different levels, i.e., a process level, a device level, and/or a circuit level may need to be analyzed and/or simulated in a unified form. Based on the high density of integration and/or the minuteness of semiconductor devices, the factors of the process, device and/or circuit levels may operate in combination.

SUMMARY

Some embodiments of the present inventive concept provide a system for executing a unified process-device-circuit simulation of the characteristics of a semiconductor apparatus. A system may include an input database that is configured to store input data including an input parameter and environment information and a unified simulator that is configured to execute a unified process-device-circuit simulation of characteristics of the semiconductor apparatus based on the input data and at least one predetermined model and to output a simulation result as output data. A system may further include an output database configured to store the output data. Some embodiments provide that the unified simulator includes a process simulator configured to simulate at least one process based on the input data and to output process characteristic data, a device simulator configured to simulate at least one device based on the process characteristic data and to output device characteristic data, and a circuit simulator configured to simulate a circuit including the at least one device.

Some embodiments include a manufacturing database that is linked with the input database and configured to store manufacturing data generated during manufacturing of the semiconductor apparatus and a rule database that is linked with the output database and configured to store standard data corresponding to the input data. Embodiments may include a post-processing analysis block that is configured to analyze the input data and the output data based on the manufacturing data and the standard data and to determine a manufacturing specification and a knowledge database that is configured to store the manufacturing specification. Some embodiments provide that the input data is set based on the manufacturing data.

In some embodiments, the input data is set by a user and the input data that is set by the user is checked based on standard data corresponding to the input data.

Some embodiments include a graphical user interface and may provide that a user sets the input data and a flow of the unified simulator and outputs the output data using the graphical user interface. In some embodiments, the input database includes a calibration database including the at least one model and multiple coefficients of the at least one model. Some embodiments provide that the at least one model includes at least one process simulation model and at least one device simulation model. In some embodiments, the process simulator deduces the process characteristic data using the input data as an input parameter of the at least one process simulation model and using a corresponding coefficient among the coefficients of the model as a coefficient of the at least one process simulation model. Some embodiments provide that the device simulator deduces the device characteristic data using the process characteristic data as an input parameter of the at least one device simulation model and using a corresponding coefficient among the coefficients of the model as a coefficient of the at least one device simulation model.

Some embodiments include a parameter extractor that is configured to deduce a coefficient of at least one circuit simulation model using the device characteristic data. The at least one model may include the at least one circuit simulation model and the circuit simulator may deduce circuit characteristic data by applying the coefficient deduced by the parameter extractor to the at least one circuit simulation model.

In some embodiments, the unified simulation system deduces circuit characteristic data by performing a predetermined operation on the device characteristic data and/or by applying the device characteristic data to a predetermined function. Some embodiments provide that the input data includes unified process data and a unified parameter that are applied to multiple devices in common and that the unified process data includes information about which process is applied to and/or which process is not applied to each of the multiple devices. In some embodiments, the unified parameter includes a variation from a standard value of a parameter with respect to each of the multiple devices. Some embodiments provide that the variation is one factor including a delta factor added to and/or subtracted from the standard value and/or a scaling factor by which the standard value is multiplied and/or divided.

Some embodiments of the present invention include methods for providing a unified simulation for a semiconductor apparatus. Such methods may include storing input data including an input parameter and environment information in an input database, executing a unified process-device-circuit simulation of characteristics of the semiconductor apparatus based on the input data and at least one predetermined model and to output a simulation result as output data, and storing the output data in an output database. In some embodiments, executing the unified process-device-circuit simulation includes simulating at least one process based on the input data and to output process characteristic data, simulating at least one device based on the process characteristic data, outputting the device characteristic data and simulating a circuit including the at least one device.

Some embodiments include storing manufacturing data generated during manufacturing of the semiconductor apparatus in a manufacturing database that is linked with the input database and storing standard data corresponding to the input data in a rule database that is linked with the output database. The input data and the output data may be analyzed based on the manufacturing data and the standard data. A manufacturing specification may be determined responsive to analyzing the input data and the output data. The manufacturing specification may be stored in a knowledge database. In some embodiments, the input data is set based on the manufacturing data.

Some embodiments include setting the input data by a user and checking the input data that is set by the user based on standard data corresponding to the input data. The input data and/or a flow of the unified simulator may be received from a user via a graphical user interface. The output data may be output using the graphical user interface.

Some embodiments include deducing the process characteristic data using the input data as an input parameter of at least one process simulation model and using a corresponding coefficient among multiple coefficients as a coefficient of the at least one process simulation model. The device characteristic data may be deduced using the process characteristic data as an input parameter of at least one device simulation model and using a corresponding coefficient among the coefficients of the model as a coefficient of the at least one device simulation model.

In some embodiments, the input data includes unified process data and a unified parameter that are applied to multiple devices in common and the unified process data includes information about which process is applied to and/or which process is not applied to each of the multiple devices. Some embodiments provide that the unified parameter includes a variation from a standard value of a parameter with respect to each of the multiple devices.

Some embodiments provide that the variation is a factor including a delta factor added to and/or subtracted from the standard value and/or a scaling factor by which the standard value is multiplied and/or divided.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

FIGS. 7A through 7C are diagrams for explaining a unified process-device-circuit simulation of a plurality of devices according to some embodiments of the present invention.

FIGS. 8A and 8B are diagrams for explaining a procedure of simulating mechanical characteristics according to some embodiments of the present invention.

DETAILED DESCRIPTION

Figure 1:
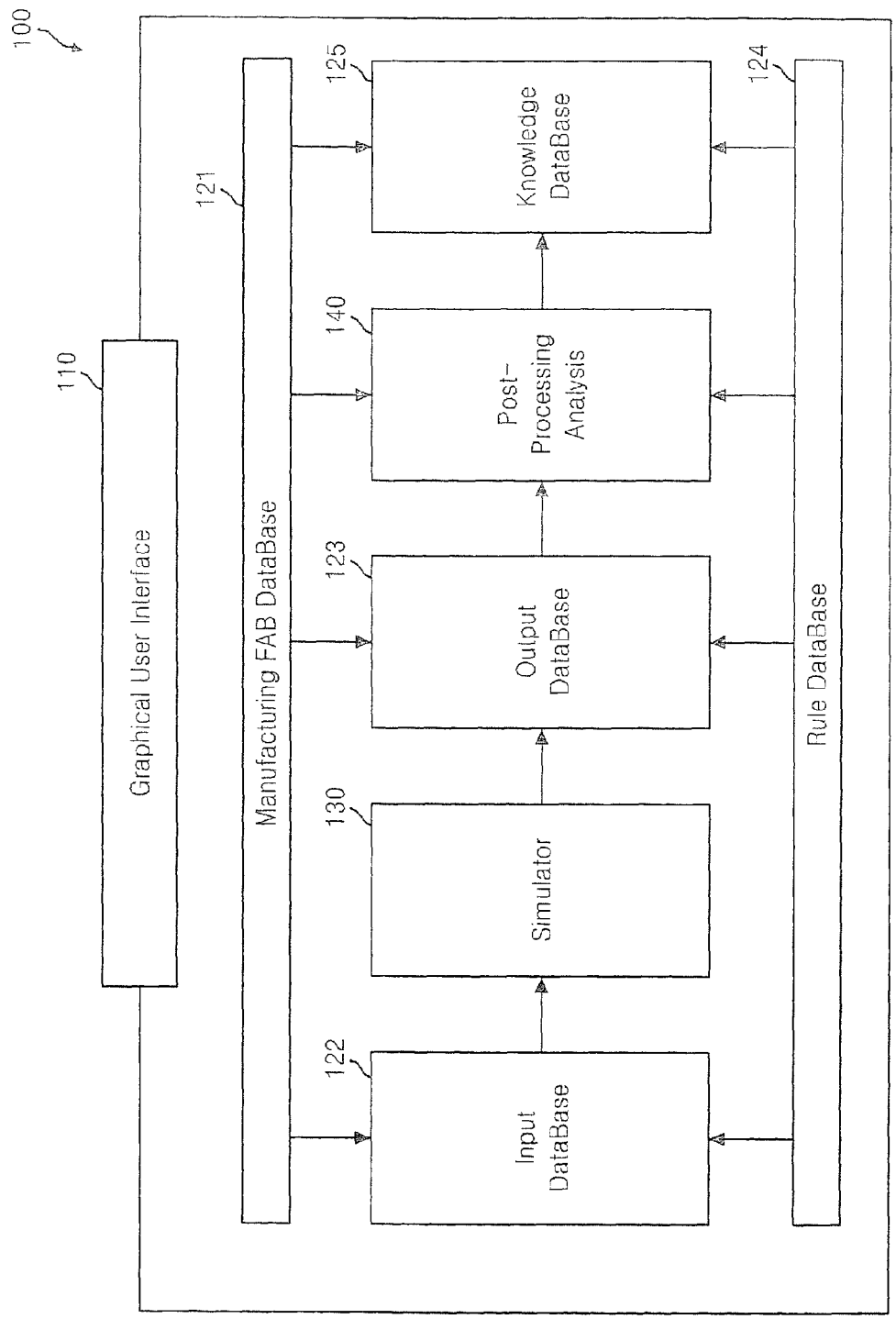
FIG. 1 is a functional block diagram of a unified simulation system according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

FIG. 1 is a functional block diagram of a unified simulation system 100 according to some embodiments of the present invention. The unified simulation system 100 includes a graphical user interface (GUI) 110, databases (DBs) 121, 122, 123, 124, and 125, a unified simulator 130, and a post-processing analysis block 140. In some embodiments, the GUI 110 may be referred to as a web GUI 110.

In some embodiments, the DBs 121 through 125 store process, device and circuit information and information about a simulation method. In detail, the DBs 121 through 125 may include a manufacturing DB 121, an input DB 122, an output DB 123, a rule DB 124, and/or a knowledge DB 125. The unified simulator 130 may analyze and/or simulate physical phenomena such as electrical characteristics, mechanical characteristics, and/or material characteristics. In some embodiments, the manufacturing DB 121 may be referred to as a manufacturing FAB DB 121.

Some embodiments provide that the input DB 122 stores input data, which may be input to the unified simulator 130. The input data may include an input parameter for a simulation and environment information. The input parameter may be used as an input parameter of a model used by simulators (e.g., a process simulator, a device simulator, and a circuit simulator which will be described later). The environment information may include other facts (e.g., a simulation flow and input/output information of each simulator) than the input parameter, which may be set by each simulator to execute a simulation.

The unified simulator 130 may receive the input data from the input DB 122, simulate the unified process-device-circuit characteristics of a semiconductor apparatus based on the input data, and/or output a simulation result as output data. The output DB 123 may store the output data received from the unified simulator 130.

Figure 2:
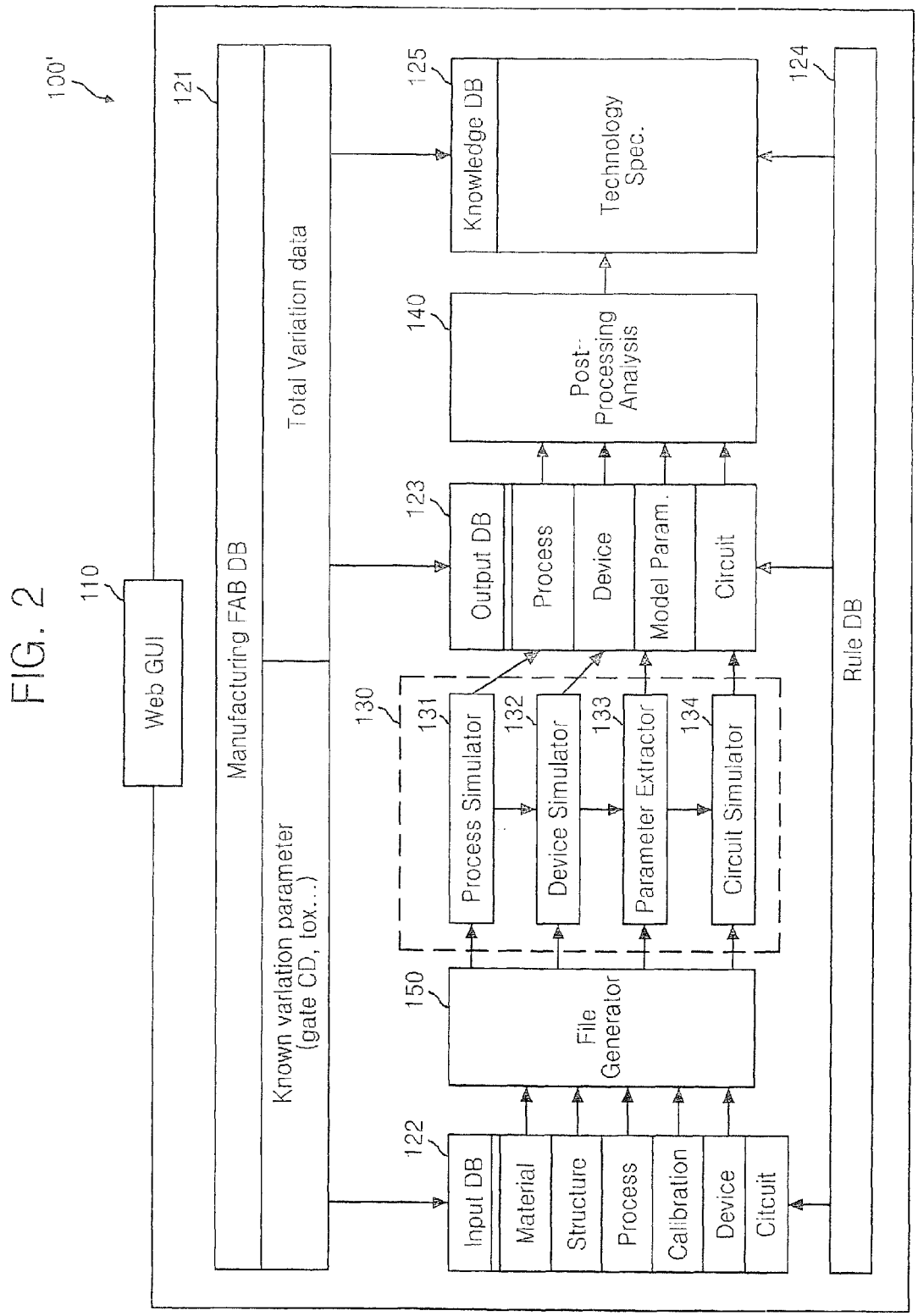
FIG. 2 is a detailed block diagram of a unified simulation system according to some embodiments of the present invention.

The manufacturing DB 121 stores data (hereinafter, referred to as manufacturing data) generated and/or measured during the manufacturing of a semiconductor apparatus. In other words, the manufacturing DB 121 may store process and/or measurement data generated during real manufacturing processes. The manufacturing DB 121 may, as is illustrated in FIG. 2, include known variation parameters generated and/or measured during real manufacturing processes and/or total variation data indicating the variation of data (e.g., on-current and off-current) output after the real manufacturing.

The rule DB 124 stores specification (spec) and/or standard related data. For instance, the rule DB 124 may include product spec data, spec data at the middle stage of a simulation, and/or information about a standard process. Here, the spec data may indicate a quantitative range predetermined with respect to a parameter and/or output characteristic data. For instance, the spec data may include a desirable quantitative range of structure data. The information about a standard process may include information about a stage that is to be included in a process simulation and/or order information of the stage.

The input DB 122 and the output DB 123 may be linked with the manufacturing DB 121 and the rule DB 124. In particular, the input data may be set based on the manufacturing data generated and/or measured during a real manufacturing process and may be stored in the manufacturing DB 121. The input data may also be set by a user using the GUI 110. The input DB 122 and/or the output DB 123 may be used to check input data set by a user in association with the rule DB 124. For instance, when input data set by a user is out of the range given by the spec data stored in the rule DB 124, the unified simulation system 100 may inform the user of the fact through the screen of the GUI 110. Further, when a user wants to set an input data, the unified simulation system 100 may display a numerical value of the spec data stored in the rule DB 124 on the screen of the GUI 110 so that the user can refer to the value.

Some embodiments provide that the output DB 123 may be linked with the rule DB 124, so that output data from the unified simulator 130 can be compared with the spec data stored in the rule DB 124. Through this comparison, knowledge-based decision support can be provided to check the output of the unified simulator 130.

In some embodiments, the post-processing analysis block 140 may compare a simulation result with the rule DB 124 and/or the manufacturing DB 121 and may analyze it. For instance, the post-processing analysis block 140 may compare the output data with the spec data and analyze how much the output data and the spec data match each other and/or are different from each other. In some embodiments, the post-processing analysis block 140 may find out output data closest to the spec data in the output data of different simulations, determine the output data closest to the spec data as a manufacturing spec, and store it in the knowledge DB 125, so that a user can use/share the output data after the simulations are completed.

Accordingly, the unified simulation system 100 may provide more than a simple simulation input-output system that is configured to set input data and provide a simulation result. For example, the unified simulation system 100 may predict processes by linking the manufacturing DB 121 that may include the process and/or measurement information generated during real manufacturing with the input DB 122 and/or the output DB 123 and execute post-processing analysis by comparing and analyzing the simulation result and the rule DB 124.

FIG. 2 is a detailed block diagram of a unified simulation system 100' according to some embodiments of the present invention. Referring to FIG. 2, the unified simulation system 100' may include a file generator 150. Some embodiments provide that the file generator 150 fetches necessary information from the input DB 122 and automatically generates an input file including a plurality of input data items which will be input to a real simulation. Accordingly, in some embodiments, the input data from the input DB 122 is not directly input to the unified simulator 130 but is input to the unified simulator 130 through the file generator 150.

The input DB 122 may include a material DB, a structure DB, a process DB, a device DB, a circuit DB, and/or a calibration DB including a coefficient of a model.

The material DB may store data (e.g., the name and the property of a material) about a material necessary for manufacturing. Some embodiments provide that the property of a material may include an electrical characteristic of the material and a mechanical characteristic thereof. For instance, the electrical characteristic may include a characteristic appearing when a voltage is applied to the material and the mechanical characteristic may include a characteristic appearing when a force (or a stress) is applied to the material.

The structure DB may include information about the size and/or layout of a device, including, for example, the thickness and/or the length of an oxide layer. The process DB may store information such as a process condition used in a process simulation.

The calibration DB may store information about a simulation model used for a simulation and/or information about a coefficient of the model. A simulation can be accomplished by executing a predetermined model. The simulation model may be a physical model and/or experimental model. Accordingly, a simulator can deduce a simulation result by calculating an output value of the model using the coefficient and/or input parameter of the model.

Some embodiments provide that the device DB may include information used to electrically test a device, including, for example, a supply voltage, test temperature, test time, and/or direct current (DC)/alternating current (AC) information.

The circuit DB may include information necessary for a circuit simulation, for example, information about connection between devices necessary to form a circuit.

In some embodiments, all input data can be controlled in a client-server terminal or the GUI 110 on the Web. After a simulation is executed in batch flow mode based on an input file generated with items selected from the input data, a result of executing the simulation may be stored in the output DB 123.

The unified simulator 130 may include a plurality of simulators, i.e., a process simulator 131, a device simulator 132, a parameter extractor 133, and/or a circuit simulator 134, among others. Each simulator may be closely related with one or more other simulators. For instance, each simulator may use an output from another simulator as an input parameter. Accordingly, the unified simulator 130 can execute a unified simulation at the process, device and circuit levels.

Some embodiments provide that a user may set a simulation flow using the GUI 110. For example, the user may select a simulator and/or a simulation sequence. When all of the simulators, i.e., the process simulator 131, the device simulator 132, the parameter extractor 133, and the circuit simulator 134 are selected, simulations may be fundamentally executed in order of a process simulation, a device simulation, and/or a circuit simulation. However, the simulation sequence may be variable and all of the process, device and/or circuit simulations may not be necessarily selected. An output at each simulation stage may be displayed on a screen through the GUI 110 and/or may be used as an input to a subsequent stage.

Figure 4A:
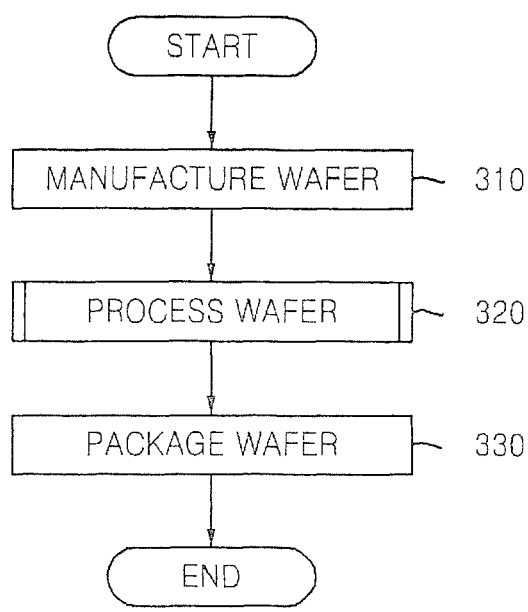
FIG. 4A is a flowchart of a procedure of manufacturing semiconductor products using a unified simulation system according to some embodiments of the present invention.

The unified simulator 130 may simulate a mechanical characteristic and/or a material characteristic of a semiconductor product as well as an electrical characteristic thereof. The unified simulator 130 may simulate a whole semiconductor product manufacturing procedure including manufacturing a wafer in operation 310, processing the wafer in operation 320, and/or packaging the wafer in operation 330, among others, as is illustrated in FIG. 4A.

Figure 4B:
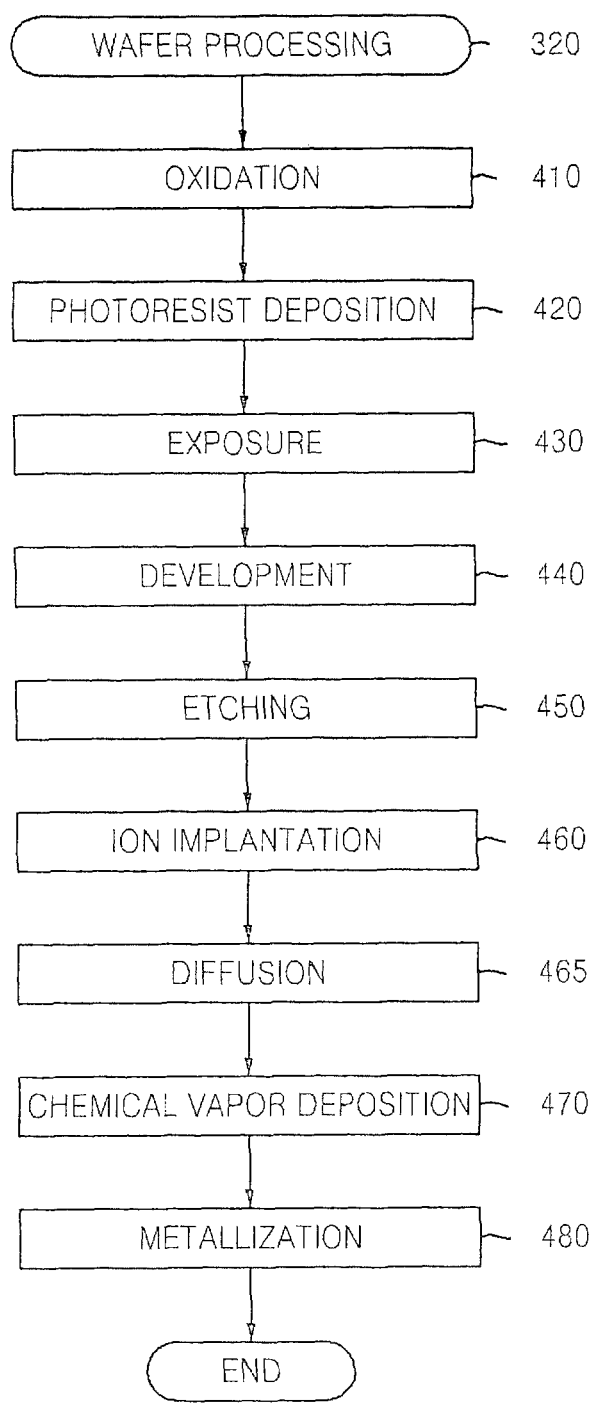
FIG. 4B is a flowchart of processes simulated by a process simulator illustrated in FIG. 2.

In detail, the process simulator 131 may simulate a process using at least one process simulation model based on material, structure and/or process input data, among others. The process simulator 131 may execute some and/or all processes included in wafer processing operation 320 as illustrated in FIG. 4B. In detail, the process simulator 131 may execute oxidation 410, photoresist deposition 420, exposure 430, development 440, etching 450, ion implantation 460, diffusion 465, chemical vapor deposition 470, and/or metallization 480, among others.

After simulating at least one process, the process simulator 131 may obtain a simulation result, i.e., process characteristic data about the shape of a structure, the shape of impurity, and/or the warpage of a substrate, among others. For instance, the process simulator 131 may execute a structure shape simulation through thin-film deposition and/or etching, an impurity shape simulation through ion implantation and/or diffusion, and/or a substrate (wafer or chip) warpage simulation.

The process simulation result obtained by the process simulator 131 may be used as an input to a device simulation and/or a unified device-circuit simulation. In case of a unified process-device-circuit simulation, a single device and/or multiple devices may be targets.

The device simulator 132 may simulate at least one device using a predetermined device simulation model based on the process simulation result output from the process simulator 131 and outputs device characteristic data. In other words, the device simulator 132 may use process characteristic data output from the process simulator 131 as an input parameter of the device simulation model and may use data corresponding to the device simulation model among data stored in the calibration DB as a coefficient, thereby calculating the device characteristic data.

Figure 3:
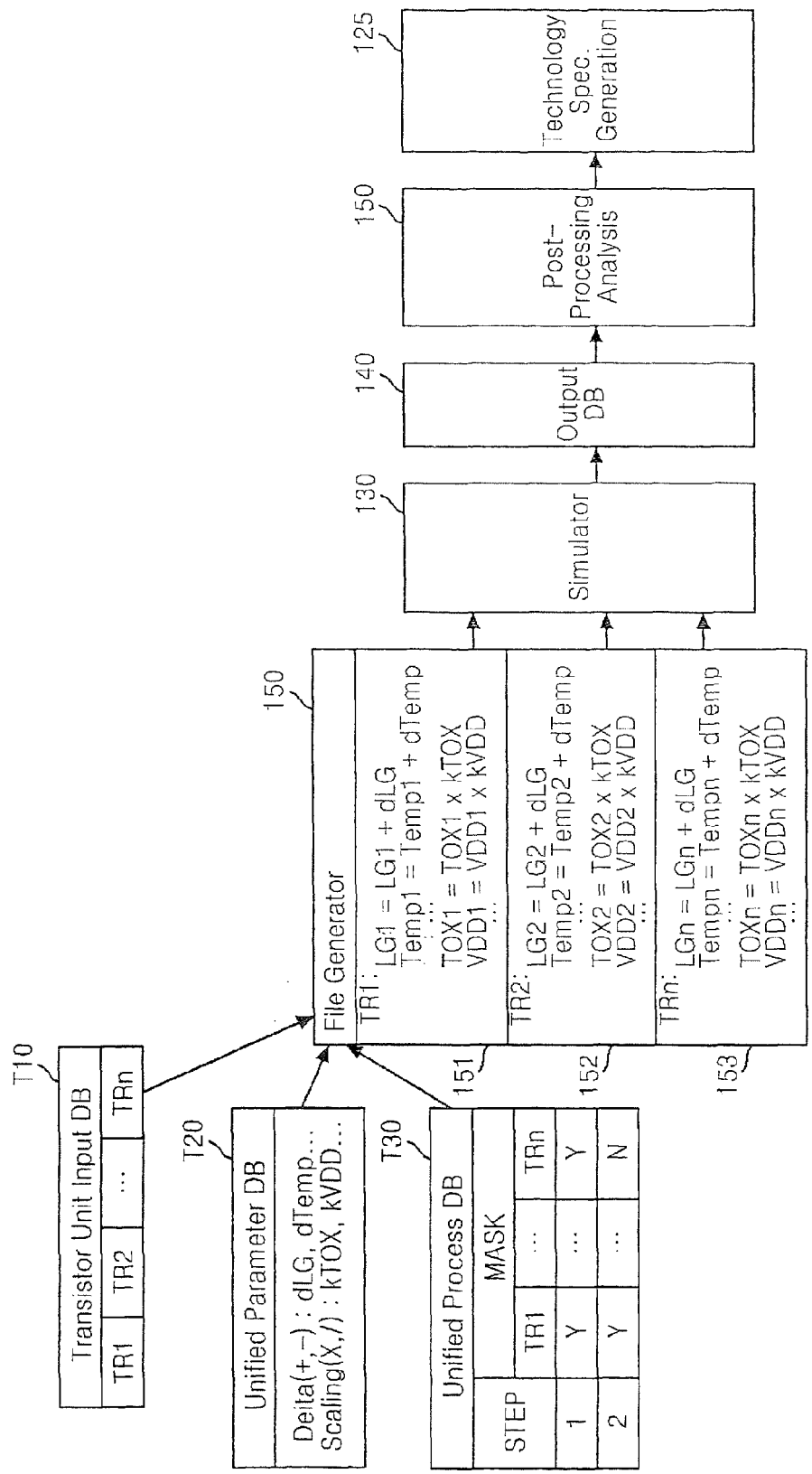
FIG. 3 is a diagram illustrating a method of controlling a simulation using a unified process and a unified parameter when a plurality of devices are simulated, according to some embodiments of the present invention.

The unified simulation system 100' may control a simulation with a unified process and/or a unified parameter when simulating a single device and/or multiple devices. FIG. 3 is a diagram illustrating methods of controlling a simulation using a unified process and a unified parameter when multiple devices are simulated according to some embodiments of the present invention. As illustrated, "n (which is 2 or an integer greater than 2)" transistors TR1 through TRn are subjected to a device simulation at the one time. However, the present invention is not so restricted. For example, the transistors TR1 through TRn may be subjected to a device simulation independently and/or in groups. Some embodiments provide that the "n" transistors TR1 through TRn may be multiple devices formed on one wafer.

An input DB T10 may include a unified process DB T30 and/or a unified parameter DB T20, which may be applied to the "n" transistors TR1 through TRn in common. The unified process DB T30 may include mask information regarding which process is applied and which process is not applied to each of the "n" transistors TR1 through TRn. In detail, the unified process DB T30 may include all process information in a form of the union of processes STEP 1 and STEP2 in manufacturing the "n" transistors TR1 through TRn and/or device selection information (Y, N) in a mask form. The information may be stored in a table format as illustrated in FIG. 3. According to the unified process DB T30 illustrated in FIG. 3, processes STEP1 and STEP2 may be applied to the transistor TR1 while the process STEP 1 may be applied to the transistor TRn.

The unified parameter DB T20 may include a unified variation from a standard value of a parameter for each of the "n" transistors TR1 through TRn. The unified variation may be expressed as a delta factor added to or subtracted from the standard value and/or as a scaling factor by which the standard value is multiplied or divided. In detail, the unified parameter DB T20 may include a gate length variation dLG and/or a temperature variation dTEMP, which may be expressed as delta factors, and/or an oxide layer thickness variation kTOX and/or a supply voltage variation kVDD, which may be expressed as scaling factors.

The unified variation may be attributed to the "n" transistors TR1 through TRn in common. For instance, for the transistor TR1, the standard value of a gate length may be LG1 and the gate length variation may be dLG. In this regard, input data adopting the variation may be (LG1+dLG). Accordingly, (LG1+dLG) may be used as input data for a gate length in the simulation of the transistor TR1. As for the other transistors TR2 through TRn, the gate length variation dLG may be added to each of standard values LG2 through LGn of the respective transistors TR2 through TRn.

The other variations dTEMP, kTOX, and/or kVDD may also be applied to corresponding standard values of each transistor in a similar manner to the manner in which the gate length variation dLG may be applied.

The file generator 150 may calculate input data using the unified process DB T30 and/or the unified parameter DB T20 with respect to the "n" transistors TR1 through TRn. The file generator may automatically generate an input file including the input data, and provide the input file to the unified simulator 130 as an input.

As described above, in some embodiments, unified process data and a unified parameter may be defined and applied in common to multiple devices simulated at the same time, so that a process variation which the multiple devices undergo in common during manufacturing can be accommodated in a simulation.

Referring back to FIG. 2, a simulation result obtained by the device simulator 132 may be input to the circuit simulator 134. The circuit simulator 134 may simulate a circuit including at least one device using a predetermined circuit simulation model. Information about the circuit simulation model, i.e., a coefficient of the model may be extracted by the parameter extractor 133. The parameter extractor 133 may calculate the coefficient of the circuit simulation model using the simulation result from the device simulator 132.

The circuit simulator 134 may execute a circuit simulation using the coefficient calculated by the parameter extractor 133 as an input of the circuit simulation model. In other words, before the output of the device simulation is linked to the circuit simulation, the coefficient of the model defined in the circuit simulator 134 may be extracted and then the circuit simulation may be executed using the model coefficient as an input.

In some embodiments, instead of extracting a model coefficient using circuit modeling, an output of a device simulation may be directly used to obtain a wanted circuit characteristic. For instance, output data of the device simulation may be subjected to a predetermined operation and/or applied to a predetermined function and an operation result and/or a function result may be calculated to obtain a circuit characteristic. Without the operation of the parameter extractor 133 and the circuit simulator 134, the output data of the device simulator 132 may be input to the post-processing analysis block 140 through the output DB 123, and the post-processing analysis block 140 may calculate circuit characteristic data through post-processing using the output data of the device simulator 132.

Figure 5:
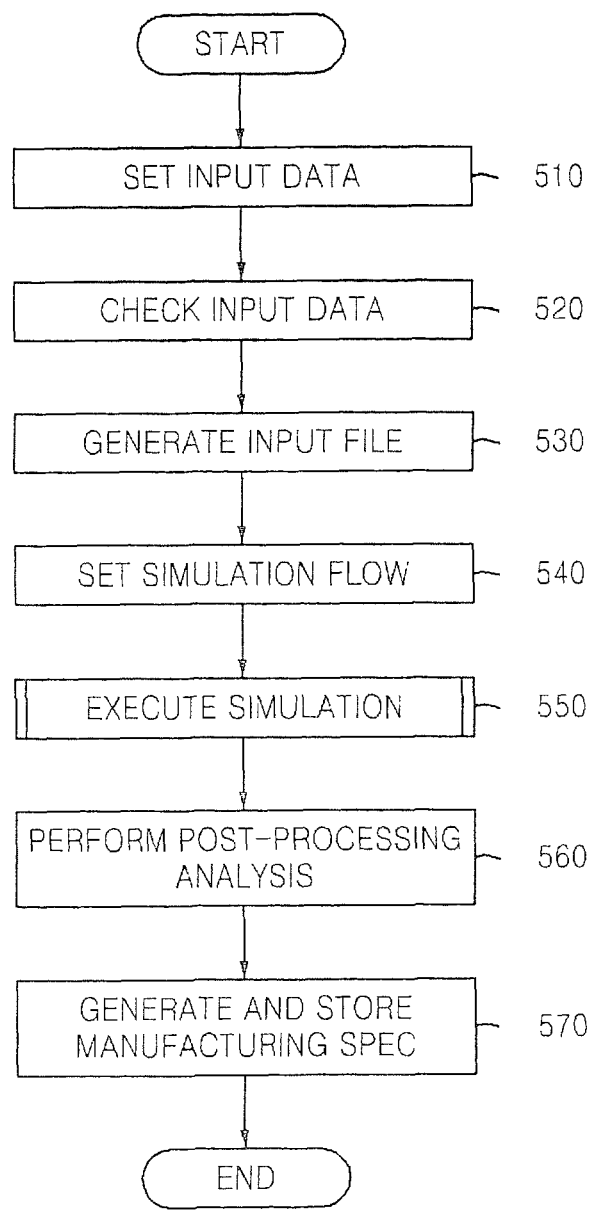
FIG. 5 is a flowchart of a unified simulation method according to some embodiments of the present invention.
Figure 6:
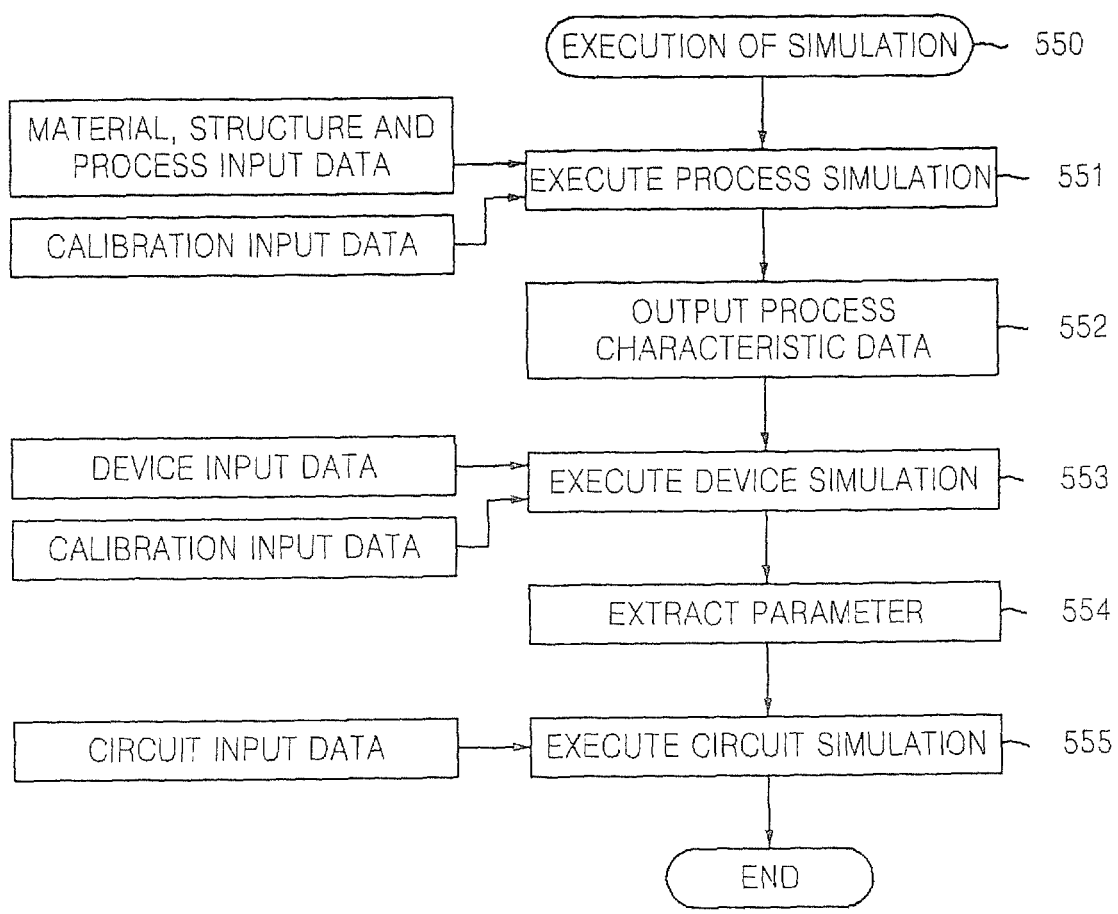
FIG. 6 is a detailed flowchart of an operation of executing a simulation illustrated in FIG. 5.
Figure 7B:
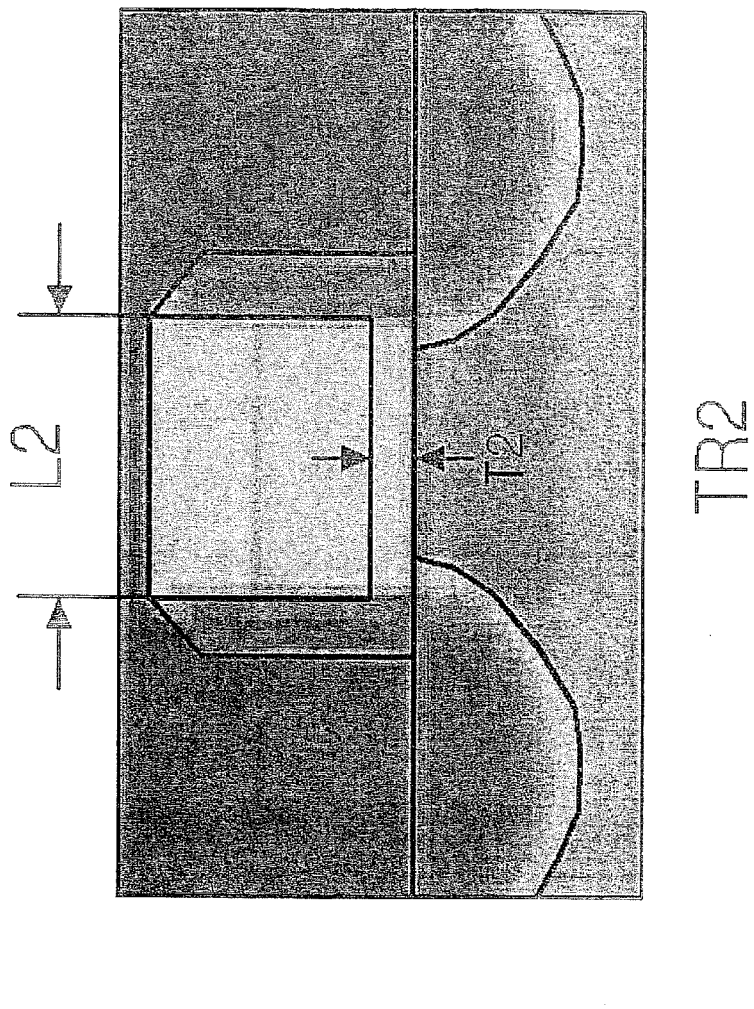
Figure 7B:
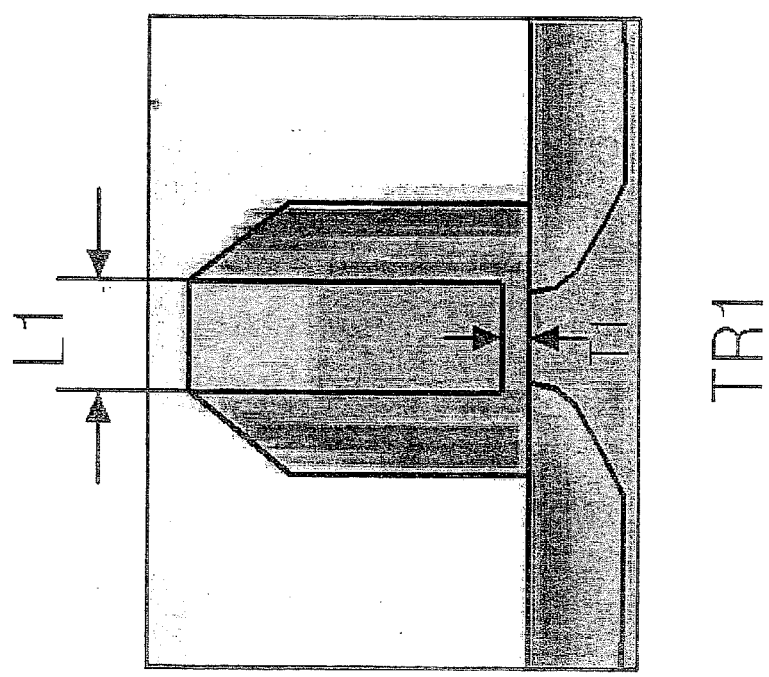
Figure 7C:
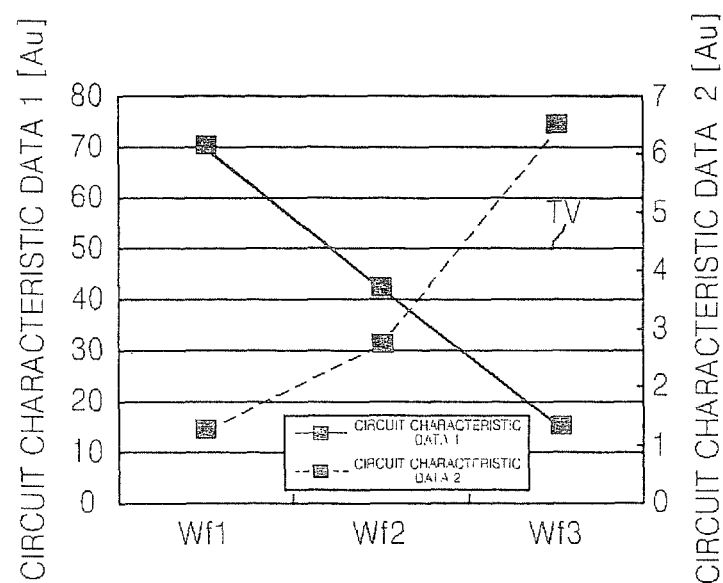

FIG. 5 is a flowchart of a unified simulation method according to some embodiments of the present invention. FIG. 6 is a detailed flowchart of the execution of a simulation illustrated in FIG. 5. FIGS. 7A through 7C are diagrams for explaining a unified process-device-circuit simulation of multiple devices according to some embodiments of the present invention. In particular, FIGS. 7A through 7C shows a unified simulation procedure in which unified parameters to be applied in common to wafers including a plurality of transistors may be set (FIG. 7A), structure shape data of transistors may be obtained as a result of a process simulation (FIG. 7B), and characteristic data of circuits including a plurality of transistors may be obtained as a result of a circuit simulation.

The unified simulation method may be performed by the unified simulation system 100' illustrated in FIG. 2. Some embodiments of unified simulation methods will be described with reference to FIGS. 5 through 7C.

Input data may be set based on manufacturing data or set by a user (block 510). The input data may be set by a user on a GUI screen, as is illustrated in FIG. 7A. The GUI screen may display a menu and a window for setting input data necessary for a simulation. Referring to FIG. 7A, unified process parameters PROCESS1 and PROCESS2 may be set for each of three wafers for a simulation of the three wafers. The unified process parameters PROCESS1 and PROCESS2 may be applied in common to multiple devices on each wafer and may be set as illustrated in FIG. 7A. As described above, the input data may be checked based on standard data (block 520).

An input file reflecting the unified parameters may be generated (block 530). The user may set a simulation flow using a GUI as described above (block 540). The simulation may be executed based on the input file (block 550). The execution of the simulation (block 550) may include operations 551 through 555 as illustrated in FIG. 6. An output of each simulation illustrated in FIG. 6 may be viewed on a GUI screen.

FIG. 7B illustrates a GUI screen showing a result of simulating the structure shapes of the transistors on each wafer analyzed by a process simulation. Although FIG. 7B illustrate just two transistors TR1 and TR2, a structure shape data of more or less transistors, e.g., "n" transistors TR1 through TRn may be viewed. From the simulation result illustrated in FIG. 7B, the user can identify that a gate length L2 of the transistor TR2 is longer than a gate length L12 of the transistor TR1 and an oxide layer thickness T2 of the transistor TR2 is thicker than an oxide layer thickness T1 of the transistor TR1.

FIG. 7C illustrates a GUI screen showing a graph form of a circuit characteristic data1 and a circuit characteristic data2 of each wafer analyzed by a circuit simulation.

After the execution of the simulation, post-processing analysis may be performed by the post-processing analysis block 140 (block 560). The post-processing analysis block 140 may compare and/or analyze the simulation results and/or the rule DB 124. For instance, the post-processing analysis block 140 may compare the circuit characteristic data1 and/or the circuit characteristic data2 resulting from the circuit simulation with corresponding standard data, i.e., a target value TV stored in the rule DB 124. As is illustrated in FIG. 7C, the standard data the target value TV may be displayed together with the circuit characteristic data1 and the circuit characteristic data2. When it is desirable that the circuit characteristic data1 and the circuit characteristic data2 are lower than the target value TV, output data for a wafer wf2 and/or input data corresponding thereto may be selected. In other words, the post-processing analysis block 140 may determine simulation conditions (i.e., input data) that are closest to the standard data through the analysis and may determine and/or store the input data as manufacturing spec (block 570).

Figure 8B:
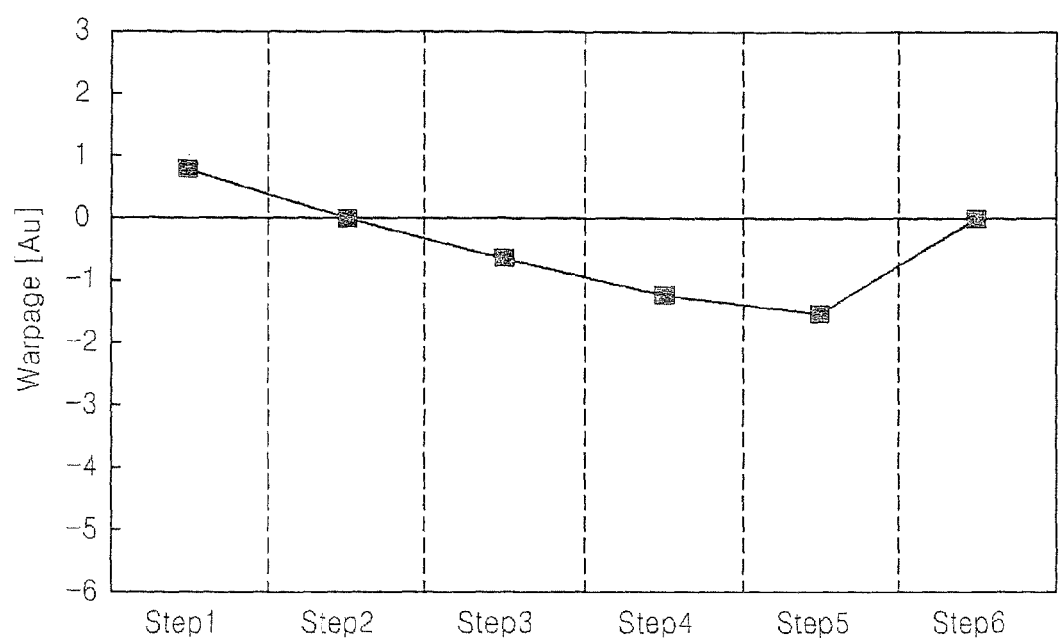

FIGS. 8A and 8B are diagrams for explaining a procedure of simulating mechanical characteristics according to some embodiments of the present invention. In particular, FIGS. 8A and 8B illustrate a procedure for deducing a warpage characteristic of a substrate through a process simulation.

FIG. 8A illustrates a GUI screen on which input data for a substrate warpage simulation in a process simulation may be provided. Some embodiments provide that input data for the warpage simulation may include the name of material, a stress index, and/or density information with respect to a layer, among others. The input data may include thickness information of the layer.

After the material name, the stress index, and/or the density are provided, a process simulator may deduce a warpage characteristic with respect to each of step 1 through step 6 using a predetermined warpage model. The warpage characteristic may be illustrated in the form of a graph, as is illustrated in FIG. 8B.

As described above, according to some embodiments of the present invention, characteristics of multiple devices at the process, device and/or circuit levels may be simulated in a unified form, so that the multiple devices can be simultaneously optimized for the optimization of circuit characteristics and an accurate spec at the process and device levels may be provided. As a result, turnaround time (TAT) for product development may be reduced. In addition, a simulation DB may be controlled through an intuitive GUI on a web server/client architecture in which data can be requested and provided. Further, a unified process-device-circuit simulation of multiple devices with linkage between the simulation DB and a manufacturing DB may be executed.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A unified simulation system for a semiconductor apparatus, the system comprising:
    an input database that is configured to store input data including an input parameter and environment information;
    a unified simulator that is configured to execute a unified process-device-circuit simulation of characteristics of the semiconductor apparatus based on the input data and at least one predetermined model and to output a simulation result as output data;
    an output database configured to store the output data;
    a manufacturing database that is linked with the input database and configured to store manufacturing data generated during manufacturing of the semiconductor apparatus;
    a rule database that is linked with the output database and configured to store information about a standard process corresponding to the input data;
    a post-processing analysis block that is configured to analyze the input data and the output data based on the manufacturing data and the information about the standard process and to determine a manufacturing specification;
    a knowledge database that is configured to store the manufacturing specification; and
    a graphical user interface, wherein a user sets the input data and a flow of the unified simulator and outputs the output data using the graphical user interface,
    wherein the unified simulator comprises:
        a process simulator configured to simulate at least one process based on the input data and to output process characteristic data;
        a device simulator configured to simulate at least one device based on the process characteristic data and to output device characteristic data; and
        a circuit simulator configured to simulate a circuit including the at least one device,
    wherein the input data includes unified process data and a unified parameter that are applied to multiple devices in common, and
    wherein the unified process data includes information about which process is applied to and/or which process is not applied to each of the multiple devices.

2. The unified simulation system of claim 1, wherein the input data is set based on the manufacturing data.

3. The unified simulation system of claim 1, wherein the input data is set by a user and the input data that is set by the user is checked based on standard data corresponding to the input data.

4. The unified simulation system of claim 1, wherein the input database comprises a calibration database comprising the at least one model and a plurality of coefficients of the at least one model.

5. The unified simulation system of claim 4, wherein the at least one model comprises at least one process simulation model and at least one device simulation model,
    wherein the process simulator calculates the process characteristic data using the input data as an input parameter of the at least one process simulation model and using a corresponding coefficient among the coefficients of the at least one model as a coefficient of the at least one process simulation model, and
    wherein the device simulator calculates the device characteristic data using the process characteristic data as an input parameter of the at least one device simulation model and using a corresponding coefficient among the coefficients of the at least one model as a coefficient of the at least one device simulation model.

6. The unified simulation system of claim 5, further comprising a parameter extractor that is configured to calculate a coefficient of at least one circuit simulation model using the device characteristic data,
    wherein the at least one model further comprises the at least one circuit simulation model, and
    wherein the circuit simulator calculates circuit characteristic data by applying the coefficient calculated by the parameter extractor to the at least one circuit simulation model.

7. The unified simulation system of claim 5, wherein the unified simulation system calculates circuit characteristic data by performing a predetermined operation on the device characteristic data and/or by applying the device characteristic data to a predetermined function.

8. The unified simulation system of claim 1,
    wherein the unified parameter includes a variation from a standard value of a parameter with respect to each of the multiple devices.

9. The unified simulation system of claim 8, wherein the variation is a factor including a delta factor added to and/or subtracted from the standard value and/or a scaling factor by which the standard value is multiplied and/or divided.

10. A method for providing a unified simulation for a semiconductor apparatus, the method comprising:
  storing input data including an input parameter and environment information in an input database;
  executing a unified process-device-circuit simulation of characteristics of the semiconductor apparatus based on the input data and at least one predetermined model and to output a simulation result as output data; and
  storing the output data in an output database;
  wherein executing the unified process-device-circuit simulation comprises:
  simulating at least one process based on the input data and to output process characteristic data;
  simulating at least one device based on the process characteristic data;
  outputting the device characteristic data;
  simulating a circuit including the at least one device;
  storing manufacturing data generated during manufacturing of the semiconductor apparatus in a manufacturing database that is linked with the input database;
  storing information about a standard process corresponding to the input data in a rule database that is linked with the output database;
  analyzing the input data and the output data based on the manufacturing data and the information about the standard process;
  determining a manufacturing specification responsive to analyzing the input data and the output data; and
  storing the manufacturing specification in a knowledge database,
  wherein the input data includes unified process data and a unified parameter that are applied to multiple devices in common, and
  wherein the unified process data includes information about which process is applied to and/or which process is not applied to each of the multiple devices.

11. The method according to claim 10, wherein the input data is set based on the manufacturing data.

12. The method according to claim 10, further comprising:
  setting the input data by a user; and
  checking the input data that is set by the user based on standard data corresponding to the input data.

13. The method according to claim 10, further comprising:
  receiving the input data from a user via a graphical user interface;
  receiving a flow of the unified simulator via the graphical user interface; and
  outputting the output data using the graphical user interface.

14. The method according to claim 10, further comprising:
  calculating the process characteristic data using the input data as an input parameter of at least one process simulation model and using a corresponding coefficient among a plurality of coefficients as a coefficient of the at least one process simulation model; and
  calculating the device characteristic data using the process characteristic data as an input parameter of at least one device simulation model and using a corresponding coefficient among the plurality of coefficients as a coefficient of the at least one device simulation model.

15. The method according to claim 10, wherein the unified parameter includes a variation from a standard value of a parameter with respect to each of the multiple devices.

16. The method according to claim 15, wherein the variation is a factor including a delta factor added to and/or subtracted from the standard value and/or a scaling factor by which the standard value is multiplied and/or divided.

17. The method according to claim 10, wherein the unified variation parameter includes a unified variation that includes at least one of a gate length variation, a temperature variation and a supply voltage variation.

* * * * *